United States Patent
Chung

(10) Patent No.: US 11,810,709 B2
(45) Date of Patent: Nov. 7, 2023

(54) CURRENT TRANSFORMER OF AIR CIRCUIT BREAKER

(71) Applicant: LS ELECTRIC CO., LTD., Anyang-si (KR)

(72) Inventor: Han-Baek Chung, Anyang-si (KR)

(73) Assignee: LS ELECTRIC CO., LTD., Anyang-Si (KR)

( * ) Notice: Subject to any disclaimer, the term of this patent is extended or adjusted under 35 U.S.C. 154(b) by 289 days.

(21) Appl. No.: 17/414,002

(22) PCT Filed: Sep. 18, 2019

(86) PCT No.: PCT/KR2019/012042
§ 371 (c)(1),
(2) Date: Jun. 15, 2021

(87) PCT Pub. No.: WO2020/138654
PCT Pub. Date: Jul. 2, 2020

(65) Prior Publication Data
US 2022/0044869 A1 Feb. 10, 2022

(30) Foreign Application Priority Data
Dec. 26, 2018 (KR) .................. 10-2018-0169803

(51) Int. Cl.
*H01F 38/30* (2006.01)
*G01R 15/18* (2006.01)
(Continued)

(52) U.S. Cl.
CPC ........... *H01F 38/30* (2013.01); *G01R 15/185* (2013.01); *H01F 27/427* (2013.01); *H02H 1/0007* (2013.01)

(58) Field of Classification Search
CPC .......... H01F 38/30; H01F 27/427; H01F 3/12; H01F 2038/305; H01F 27/24; G01R 15/185; H02H 1/0007; H01H 71/125
See application file for complete search history.

(56) References Cited

U.S. PATENT DOCUMENTS

| 5,726,846 A | 3/1998 | Houbre |
| 9,541,580 B2 | 1/2017 | Nodera et al. |

(Continued)

FOREIGN PATENT DOCUMENTS

| CN | 101685725 A | 3/2010 |
| CN | 102800471 A | 11/2012 |

(Continued)

OTHER PUBLICATIONS

Office Action for related Japanese Application No. 2021-531847; action dated Jun. 7, 2022; (5 pages).

(Continued)

*Primary Examiner* — Christopher P McAndrew
*Assistant Examiner* — Zannatul Ferdous
(74) *Attorney, Agent, or Firm* — K&L Gates LLP

(57) ABSTRACT

A current transformer according to the present invention may comprise a magnetic core, a secondary coil, and a magnetic flux compensation member. A main circuit of an air circuit breaker penetrates the magnetic core. In addition, the secondary coil is arranged to be adjacent to the magnetic core, and a secondary current is induced through a current flowing in the main circuit. In addition, the secondary coil supplies the induced secondary current to a relay. The magnetic flux compensation member may be coupled to the magnetic core so as to correct magnetic flux of the secondary coil.

6 Claims, 7 Drawing Sheets

(51) Int. Cl.
*H01F 27/42* (2006.01)
*H02H 1/00* (2006.01)

(56) References Cited

U.S. PATENT DOCUMENTS

| | | | |
|---|---|---|---|
| 10,483,751 | B2 | 11/2019 | Seon |
| 11,295,885 | B2 | 4/2022 | Mas et al. |
| 2007/0086131 | A1* | 4/2007 | Miller ............... H01F 38/30 361/62 |
| 2013/0314083 | A1 | 11/2013 | Loglisci |
| 2014/0049351 | A1* | 2/2014 | Carsten ............... H01F 27/25 336/213 |
| 2015/0206645 | A1* | 7/2015 | Cook ............... H01F 27/02 336/216 |
| 2015/0371748 | A1 | 12/2015 | Kim |
| 2017/0169980 | A1* | 6/2017 | Dorella ............... H01H 9/54 |
| 2017/0229236 | A1 | 8/2017 | Wang et al. |

FOREIGN PATENT DOCUMENTS

| | | |
|---|---|---|
| EP | 1551039 A2 | 7/2005 |
| EP | 3179494 A1 | 6/2017 |
| EP | 3660875 A1 | 6/2020 |
| JP | S57146321 U | 9/1982 |
| JP | 2001264364 A | 9/2001 |
| JP | 2002064019 A | 2/2002 |
| JP | 2013178205 A | 9/2013 |
| JP | 2013225980 A | 10/2013 |
| JP | 2018112535 A | 7/2018 |
| KR | 1020060015339 A | 2/2006 |
| KR | 100657645 B1 | 12/2006 |
| KR | 20170123094 A | 11/2017 |

OTHER PUBLICATIONS

Extended European Search Report for related European Application No. 19902184.1; action dated Feb. 8, 2022; (12 pages).
International Search Report for related International Application No. PCT/KR2019/012042; report dated Jul. 2, 2020; (5 pages).
Written Opinion for related International Application No. PCT/KR2019/012042; report dated Jul. 2, 2020; (5 pages).

* cited by examiner

CURRENT TRANSFORMER OF AIR CIRCUIT BREAKER

CROSS-REFERENCE TO RELATED APPLICATIONS

This application is the National Stage filing under 35 U.S.C. 371 of International Application No. PCT/KR2019/012042, filed on Sep. 18, 2019, which claims the benefit of earlier filing date and right of priority to Korea utility model Application No. 10-2018-0169803 filed on Dec. 26, 2018, the contents of which are all hereby incorporated by reference herein in their entirety.

FIELD

The present disclosure relates to a current transformer of an air circuit breaker.

BACKGROUND

In general, an air circuit breaker is used in a distribution box in a power plant or a substation.

When abnormal currents such as overcurrent, short circuit and ground fault occur in the distribution box, the air circuit breaker blocks the currents. A relay is installed in the air circuit breaker to block the current when the abnormal current occurs. The relay operates upon receiving a secondary current generated from a current transformer.

The current transformer includes a magnetic core through which a main circuit through which AC current flows extends. A primary current is induced in the magnetic core. A secondary coil is placed adjacent to the magnetic core, and a secondary current of a magnitude proportional to that of the current flowing through the main circuit is induced in the secondary coil, and the secondary current induced through the secondary coil is supplied to the relay.

In this connection, when the current flowing through the main circuit is in a low current region, there is no problem with the magnitude of the current supplied to the relay. When the current flowing through the main circuit flows for a long time in a rated current region, the magnitude of the secondary current increases, thereby causing a problem that the current transformer is heated.

To solve this problem, a magnetic flux flowing adjacent to the secondary coil is compensated so that the secondary current is induced to have a sufficient magnitude in the low current region, and the magnetic flux of the secondary coil is reduced to stabilize the secondary current in a normal current region.

Therefore, a method for solving these problems is required.

SUMMARY

The present disclosure is conceived to solve the problems of the prior art. Thus, a purpose of the present disclosure is to stably supply the secondary current induced through the current transformer to the relay. Further, a purpose of the present disclosure is to provide a current transformer with a small volume while reducing a risk of fire by reducing the heat generation of the magnetic core.

The purposes of the present disclosure are not limited to the purposes mentioned above, and other purposes that are not mentioned will be clearly understood by those skilled in the art from the following description.

The current transformer according to the present disclosure to achieve the above purpose may include a magnetic core, a secondary coil and a magnetic flux compensation member. The main circuit of the air circuit breaker passes through the magnetic core. Further, the secondary coil is disposed adjacent to the magnetic core and the secondary current is induced through the current flowing through the main circuit. Further, the secondary coil supplies the induced secondary current to the relay. The magnetic flux compensation member is coupled to the magnetic core to compensate for the current induced in the secondary coil.

In one embodiment of the present disclosure, the magnetic flux compensation member may be coupled to both side faces of the magnetic core.

In one embodiment of the present disclosure, the magnetic flux compensation member may be embodied as a plate member having a predetermined thickness.

In one embodiment of the present disclosure, the magnetic flux compensation member may be embodied as a stack of a plurality of plate-shaped members spaced from each other, each having a predetermined thickness, and may be coupled to the magnetic core.

In one embodiment of the present disclosure, the magnetic core has a through-hole defined therein through which the main circuit passes, wherein the secondary coil is coupled to a first shunt spaced from the magnetic core by a predetermined distance, wherein the magnetic flux compensation member extends vertically by a first distance, wherein a virtual connection line having a shortest distance and connecting the secondary coil and the main circuit to other overlaps the magnetic core by the first distance.

In one embodiment of the present disclosure, the magnetic flux compensation member includes a plate-shaped member having a predetermined thickness and having a vertical dimension equal to the first distance.

The current transformer according to the present disclosure to solve the above problems increases the magnetic flux of the secondary coil when the main circuit of the air circuit breaker is in a low current region, and supplies a sufficient magnitude of the secondary current to the relay. When the main circuit is in a normal current region, the current transformer according to the present disclosure may reduce the magnetic flux of the secondary coil, thereby stabilizing the secondary current. Further, when the main circuit is in a normal current region, the secondary current is stabilized, such that the heat generation is reduced, thereby reducing the risk of the fire.

Further, since the magnetic core has a relatively small volume, the utilization of space is increased, and the risk of noise or damage due to vibration is reduced.

The effects of the present disclosure are not limited to the effects mentioned above, and other effects not mentioned will be clearly understood by those skilled in the art from the description of the claims.

DETAILED DESCRIPTION

Figure 1:
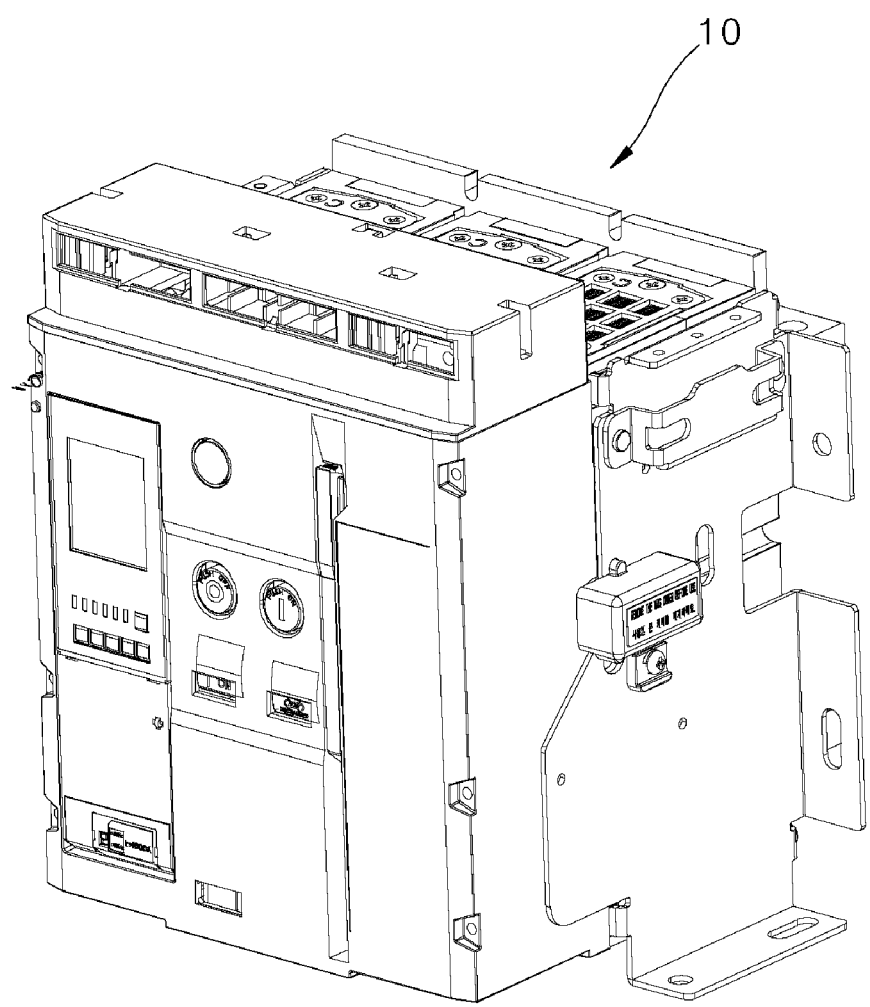
FIG. 1 shows an air circuit breaker.

The above-described objects, features, and advantages will be described later in detail with reference to the accompanying drawings, and accordingly, a person having ordinary knowledge in the technical field to which the present disclosure belongs may easily implement the technical idea of the present disclosure. In describing the present disclosure, when it is determined that a detailed description of a known component related to the present disclosure may unnecessarily obscure gist of the present disclosure, the detailed description is omitted.

Hereinafter, exemplary embodiments according to the present disclosure will be illustrated in detail with reference to the accompanying drawings. In the drawings, the same reference numerals indicate the same or similar elements.

Hereinafter, a current transformer according to some embodiments of the present disclosure will be described.

Figure 2:
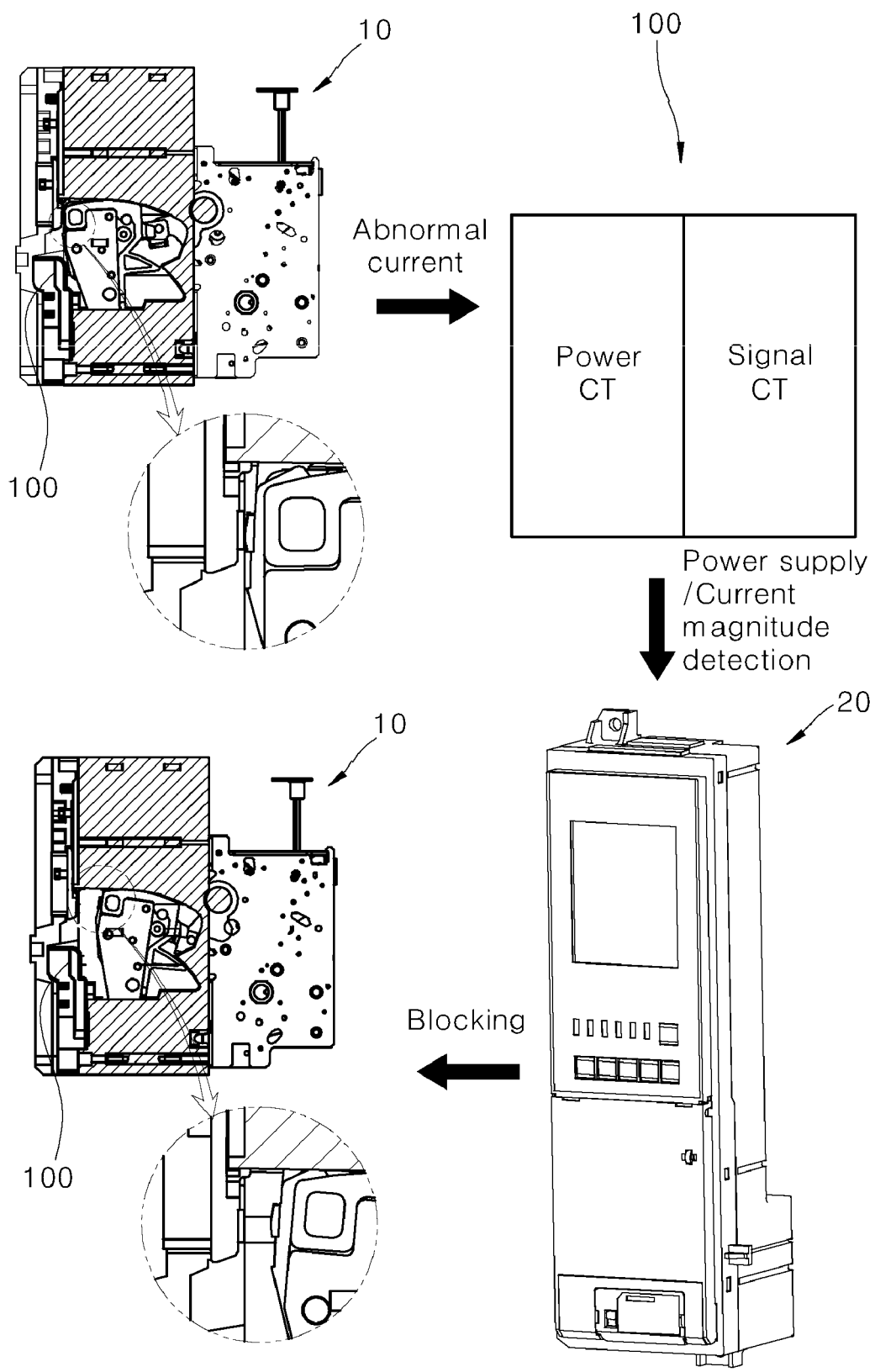
FIG. 2 schematically shows a process in which a current transformer and a relay of the air circuit breaker block an abnormal current.

FIG. 1 shows the air circuit breaker. FIG. 2 schematically shows a process in which the current transformer and a relay 20 of the air circuit breaker block the abnormal current.

The current transformer according to one embodiment of the present disclosure may be included in an air circuit breaker.

As shown in FIG. 2, the current applied to the air circuit breaker flows along the main circuit, and the current flowing in the main circuit induces the secondary current through the current transformer according to the present disclosure. The induced secondary current is fed to the relay 20 to activate the relay 20.

When the abnormal current such as overcurrent, short circuit and ground fault occurs in the main circuit of the air circuit breaker, the relay 20 immediately cuts off the current of the air circuit breaker, and the secondary current induced through the current transformer 100 according to the present disclosure may be used as the current to activate the relay 20.

As shown in FIG. 2, the current transformer 100 according to the present disclosure includes a power current transformer (Power CT) and a signal current transformer (Signal CT).

The power current transformer is composed of a magnet to induce the secondary current. The secondary current derived from the power current transformer is supplied to the relay 20.

Further, a signal current transformer composed of a Rogowski coil delivers a signal magnitude of the current to the relay 20.

The relay 20 operates using the current supplied from the power current transformer, and controls the air circuit breaker according to the signal magnitude of the current input through the signal current transformer.

Figure 3:
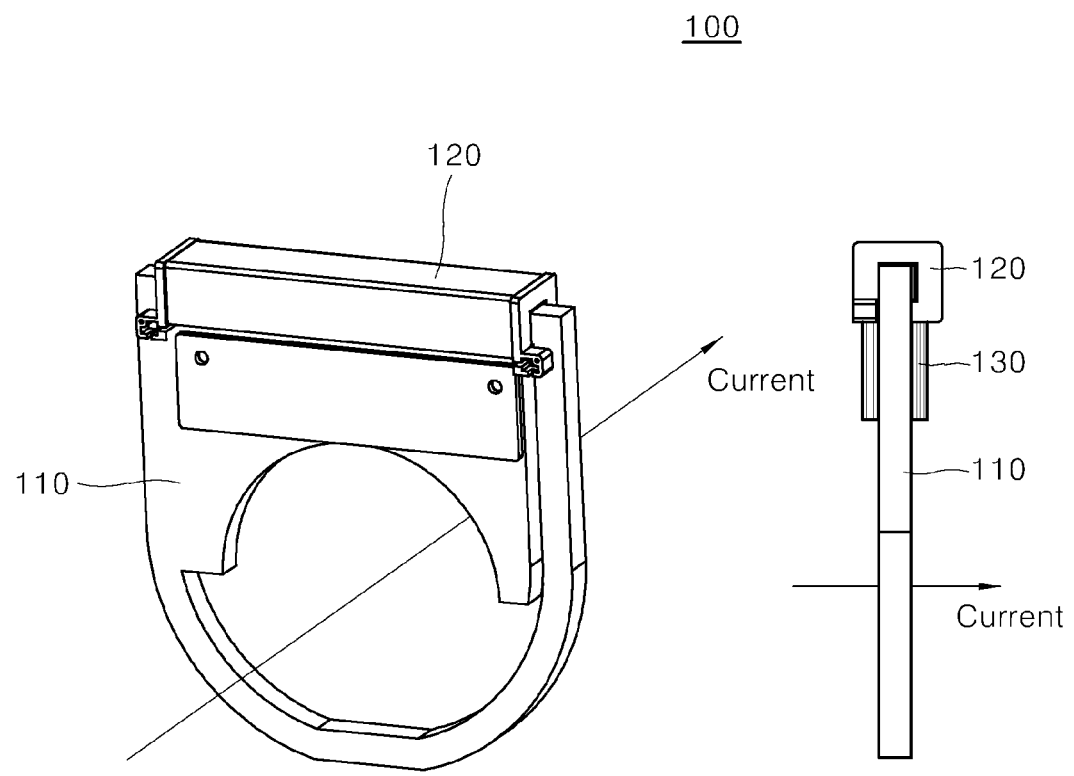
FIG. 3 is a perspective view and a side view of a current transformer according to one embodiment of the present disclosure.
Figure 4:
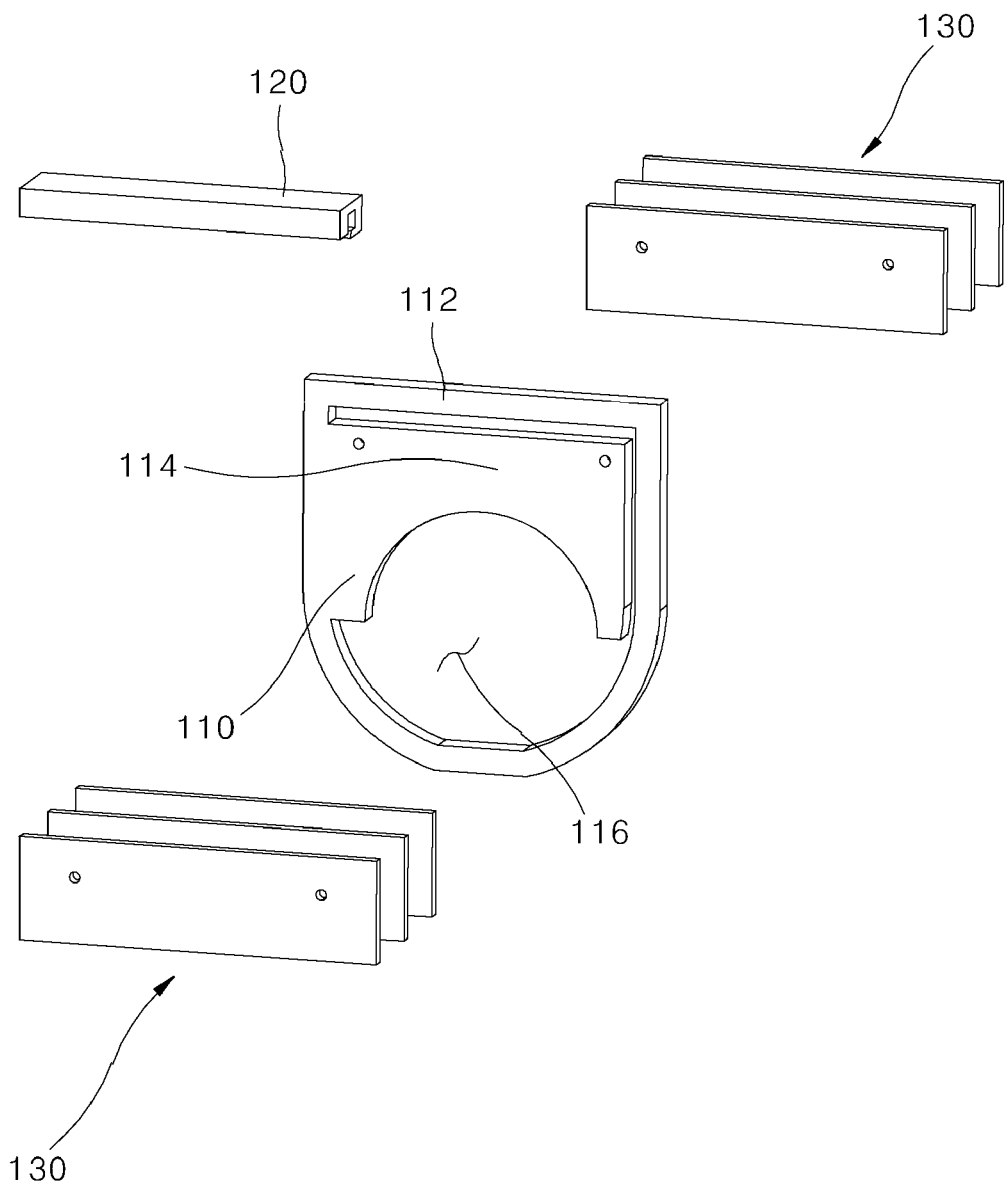
FIG. 4 is an exploded perspective view of a current transformer according to one embodiment of the present disclosure.
Figure 5:
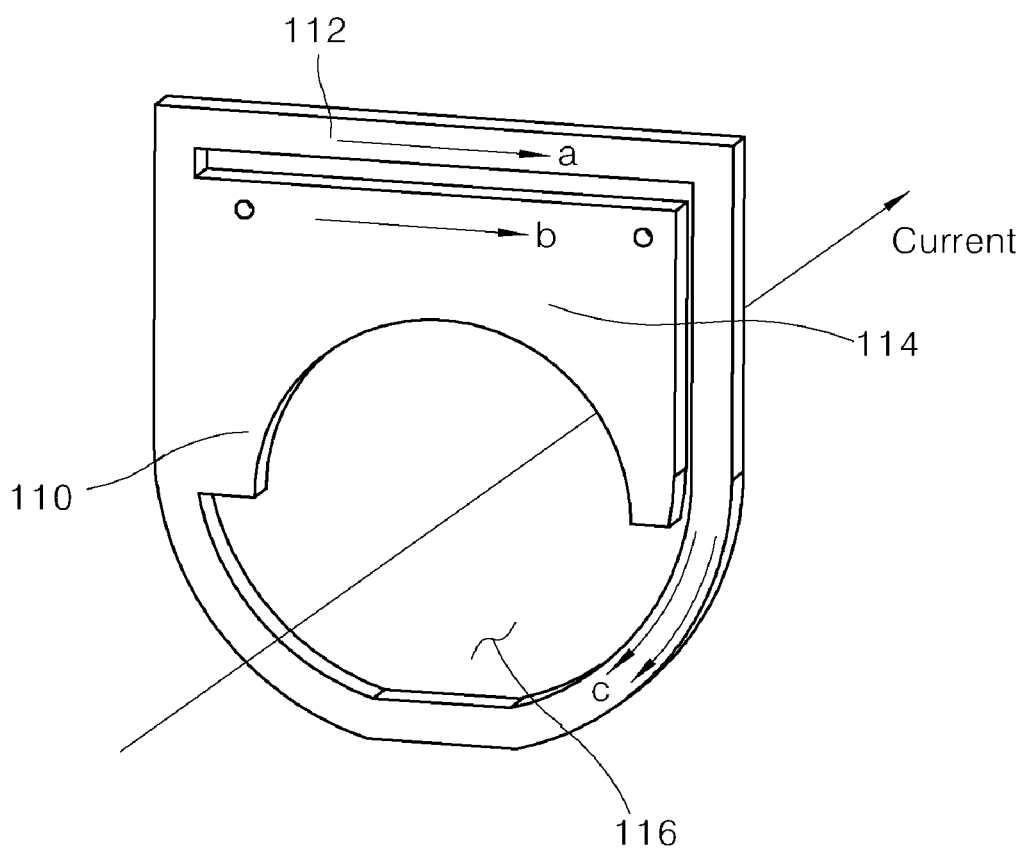
FIG. 5 is a perspective view of a magnetic core in a current transformer according to one embodiment of the present disclosure.

FIG. 3 is a perspective view and a side view of the current transformer according to one embodiment of the present disclosure. FIG. 4 is an exploded perspective view of the current transformer according to one embodiment of the present disclosure. FIG. 5 is a perspective view of a magnetic core in the current transformer according to one embodiment of the present disclosure.

As shown in FIG. 3 and FIG. 4, the current transformer 100 according to one embodiment of the present disclosure includes a magnetic core 110, a secondary coil 120 and a magnetic flux compensation member 130.

The main circuit of the air circuit breaker 10 passes through the magnetic core 110. Further, the secondary coil 120 is disposed adjacent to the magnetic core 110, and the secondary current is induced in the secondary coil 120 due to the current flowing through the main circuit.

The magnetic flux compensation member 130 is coupled to the magnetic core 110. Further, the magnetic flux compensation member 130 may compensate for the current induced in the secondary coil 120.

Each of the above-described components will be described in more detail below.

The magnetic core 110 is made of a magnetic material. In one embodiment of the present disclosure, the magnetic core 110 may be embodied as a plate-like member having a predetermined thickness, and may have a through-hole 116 defined therein through which the main circuit of the air circuit breaker passes.

The through-hole 116 may be sized such that an inner face thereof is not in contact with the main circuit. The main circuit passes through a center region of the through-hole 116 in a perpendicular direction to a virtual plane formed by the through-hole 116. Further, the through-hole 116 may have a circular shape.

The magnetic core 110 includes a first shunt 112 and a second shunt 114 in which the magnetic flux is induced from the main circuit passing through the through-hole 116.

When the current is applied to the main circuit, the magnetic flux is induced in the magnet around the main circuit. Therefore, the magnetic core 110 is divided so that the magnet constituting the magnetic core 110 has at least two paths at one side of the through-hole 116 through which the main circuit passes.

In this connection, among the two paths, the first shunt 112 is a path relatively far from the through-hole 116, and the second shunt 114 is a path relatively closer to the through-hole 116.

As shown in FIG. 5, when the current is applied to the main circuit, a magnetic field is generated along a circumference of the main circuit. The magnetic field generated around the main circuit generates a magnetic flux in one direction along the magnetic core 110.

In this connection, the first shunt 112 and the second shunt 114 may divide the magnetic flux induced through the main circuit into a first flux a and a second flux b, respectively. A section of the magnetic core 110 in which the magnet has one path around the through-hole 116 through the main circuit passes is represented as c in the drawing in which a single magnetic flux is generated.

The secondary coil 120 is coupled to the magnetic core 110 and extends in an elongate manner along a longitudinal direction of the first shunt 112. The number of windings of the secondary coil 120 may be determined according to an embodiment to which the present disclosure is applied.

Accordingly, the secondary current induced from the current flowing through the main circuit flows through the secondary coil 120, and the secondary current is affected by the magnetic flux induced in the first shunt 112. Specifically, the secondary current induced in the secondary coil 120 has a magnitude that is proportional to a magnitude of the magnetic flux generated in the first shunt 112.

The secondary current flowing through the secondary coil 120 is supplied to the relay 20 as described above, and thus the relay 20 is activated using the secondary current.

The current applied to the main circuit of the air circuit breaker is not always maintained in a constant region.

Current in a low current region or a rated current region (high current region) may flow along the main circuit.

In particular, when the current in the rated current region flows along the main circuit, the magnitude of the secondary current induced in the secondary coil 120 may increase. As the magnitude of the secondary current increases, overheating or ignition due to overheating may occur.

The magnetic flux compensation member 130 may act as a conductor coupled to the second shunt 114 and may compensate for the magnetic flux generated in the first shunt 112 so that a stable secondary current is finally supplied to the relay.

The magnetic flux compensation member 130 may be embodied as a plate-shaped member having a predetermined thickness. In one embodiment of the present disclosure, the magnetic flux compensation member 130 may be implemented as a rectangular plate member.

As shown in FIG. 4, the magnetic flux compensation member 130 is coupled to the magnetic core 110 and may be embodied as a stack of a plurality of thin plate-like members spaced from each other.

In this connection, the magnetic flux compensation member 130 may be coupled to the second shunt 114 of the magnetic core 110. The magnetic flux compensation member 130 may include many opposing plates sandwiching the magnetic core 110 therebetween.

The magnetic flux compensation member 130 acts to reduce the magnetic flux of the first shunt 112 when the current flowing in the main circuit belongs to the rated current region.

Specifically, the magnitude of the magnetic flux is obtained as a product of an intensity of the magnetic field and an area through which the magnetic field passes. Accordingly, the second shunt 114 to which the magnetic flux compensation member 130 is coupled has a relatively larger cross-sectional area than that of the magnet of the first shunt 112. Therefore, under the same condition, the magnetic flux induced from the second shunt 114 having a wider cross-sectional area is greater than that from the first shunt 112. The magnitude of the magnetic flux induced from the first shunt 112 is relatively small.

The reduced magnetic flux from the first shunt 112 reduces the magnitude of the current induced in the secondary coil 120. Accordingly, the current transformer 100 according to the present disclosure is not exposed to overheating or fire hazard.

The magnetic flux compensation member 130 is not disposed only on a partial section of the second shunt 114, but face-contacts the magnetic core 110 in the entire section of the second shunt 114.

Figure 6:
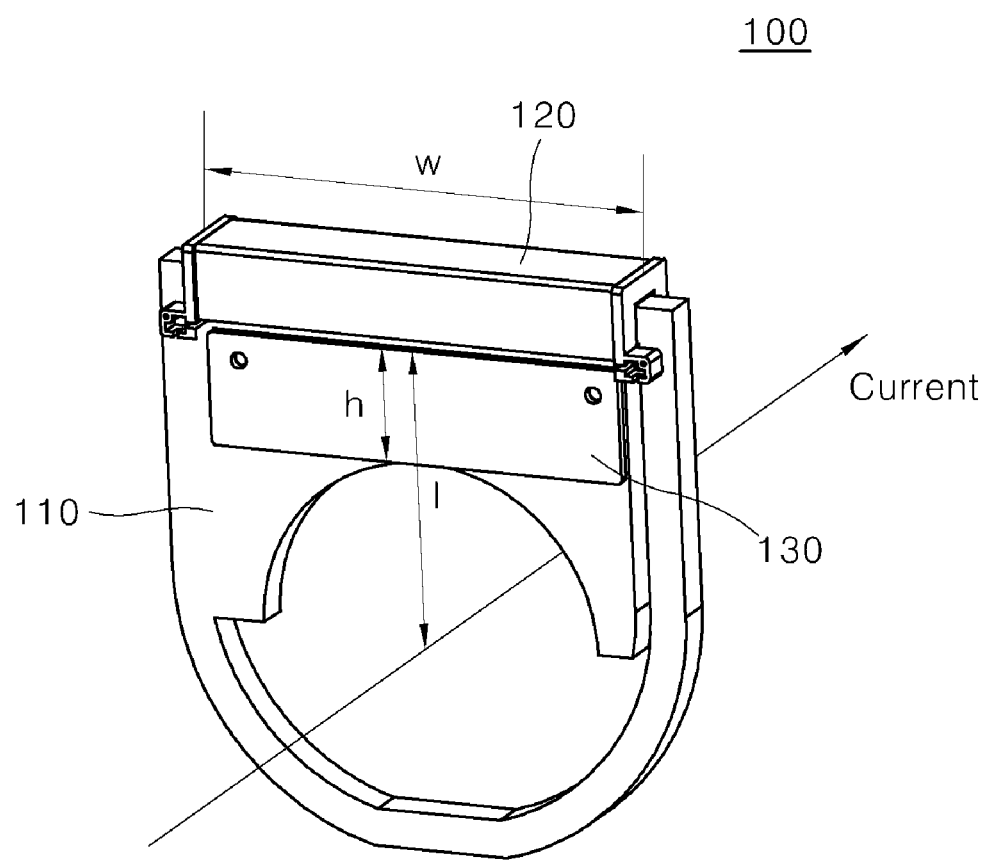
FIG. 6 is a perspective view showing a coupling position and a size of a magnetic flux compensation member in a current transformer according to one embodiment of the present disclosure.

FIG. 6 is a perspective view showing a coupling position and a size of the magnetic flux compensation member in the current transformer according to one embodiment of the present disclosure.

As shown in FIG. 6, assuming that a shortest virtual straight line connecting the main circuit and the secondary coil is denoted as 1, a distance at which the virtual straight line 1 and the magnetic core 110 overlap each other is h. Therefore, the magnetic flux compensation member 130 is in face-contact with the magnetic core 110 along the distance h at which the virtual straight line 1 and the magnetic core 110 overlap each other.

This limitation is intended to place the magnetic flux compensation member 130 in the widest area between the main circuit and the secondary coil 120 within a size of the magnetic core 110.

Further, the magnetic flux compensation member 130 may be formed to have a length of w corresponding to a length of the secondary coil 120.

When the magnetic flux compensation member 130 is disposed on the magnetic core 110 and on a larger area thereof, the number of plate-like members of the magnetic flux compensation member 130 overlapping each other may be reduced, which prevents the magnetic flux compensation member 130 from protruding significantly from the magnetic core 110.

Further, in one embodiment of the present disclosure, h is defined as a vertical dimension of the magnetic flux compensation member 130, and a width w is defined as the width of the magnetic flux compensation member 130. Further, in a state in which the magnetic flux compensation member 130 is coupled to the magnetic core 110, a dimension in a direction in which the current flows in the main circuit is defined as a thickness of the magnetic flux compensation member 130.

Accordingly, the magnetic flux compensation member 130 is implemented as a plate-shaped member having a predetermined thickness and the vertical dimension h along which the shortest virtual connection line 1 connecting between the main circuit and the secondary coil overlaps the magnetic core 110.

Figure 7:
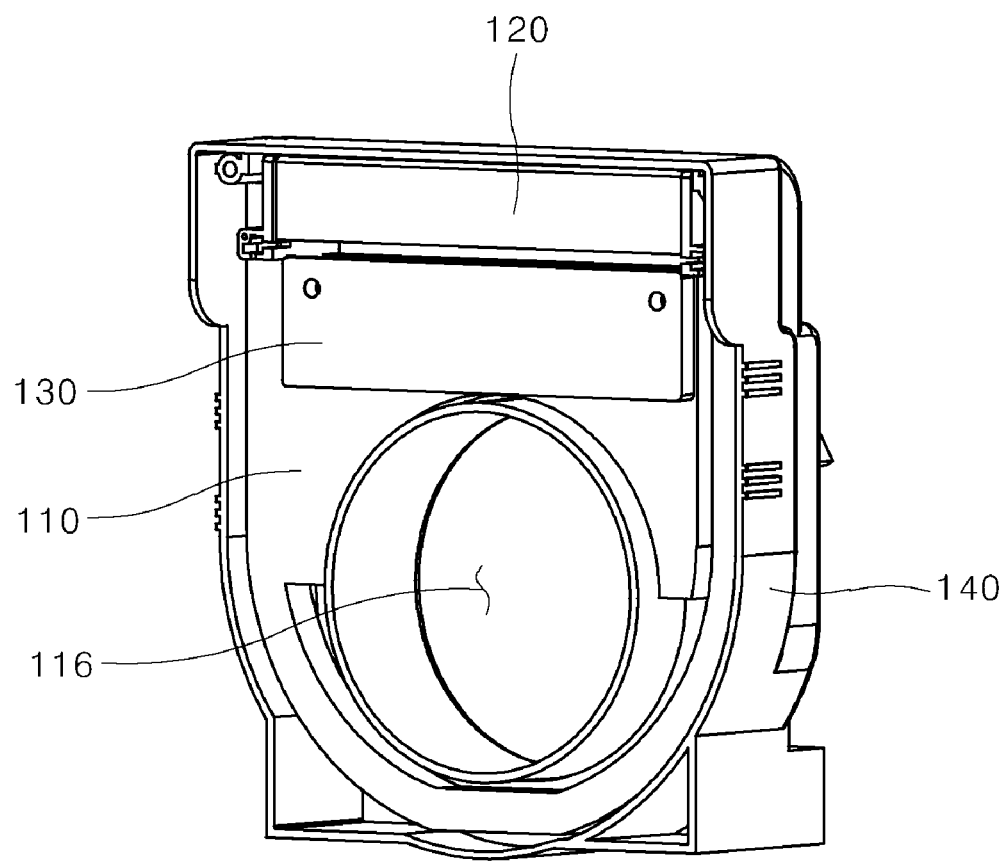
FIG. 7 is a perspective view showing a state in which a current transformer according to one embodiment of the present disclosure is coupled to a housing.

FIG. 7 is a perspective view showing a state in which the current transformer according to one embodiment of the present disclosure is coupled to a housing.

As shown in FIG. 7, the current transformer 100 according to the present disclosure may be accommodated in a housing 140. Alternatively, a mold may be formed on an outer face of the current transformer 100 and protect the current transformer 100.

In this connection, when the magnetic flux compensation member 130 protrudes significantly from the magnetic core 110, the housing 140 or the molding may not completely receive the current transformer 100.

Further, the magnetic flux compensation member 130 may be vulnerable to vibration due to a large protruding dimension thereof, and may be damaged due to repeated vibration and external force.

Due to the characteristics that the magnetic flux changes according to the cross-sectional area, the magnetic flux compensation member 130 of the current transformer 100 according to the present disclosure may face-contact the magnetic core 110 on a as wide area as possible, thereby to minimize the protruding dimension of the magnetic flux compensation member 130.

Therefore, the effect of improving the stability against the vibration may be obtained using the current transformer 100 according to the present disclosure.

As described above, preferred embodiments according to the present disclosure have been described. A fact that the present disclosure may be embodied in other specific forms without departing from a purpose or scope thereof in addition to the above-described embodiments is obvious to the skilled person to the art. Therefore, the above-described embodiments should be regarded as illustrative rather than restrictive, and accordingly, the present disclosure is not limited to the above description and may be changed within the scope of the appended claims and equivalents thereof

What is claimed is:

1. A current transformer comprising:
a magnetic core through which a main circuit of an air circuit breaker passes;
a secondary coil disposed adjacent to the magnetic core to induce a secondary current from a current flowing through the main circuit and to supply the secondary current to a relay; and
a magnetic flux compensation member coupled to the magnetic core to compensate for the current induced from the secondary coil,
wherein the magnetic core has a through-hole defined therein through which the main circuit passes, and
wherein the secondary coil is coupled to a first shunt spaced from the magnetic core by a predetermined distance.

2. The current transformer of claim 1, wherein the magnetic flux compensation member is coupled to both side faces of the magnetic core.

3. The current transformer of claim 1, wherein the magnetic flux compensation member is embodied as a plate-like member having a predetermined thickness.

4. The current transformer of claim 3, wherein the magnetic flux compensation member includes a plurality of plate-like members having a predetermined thickness and coupled to the magnetic core and overlapping each other.

5. The current transformer of claim 1,
wherein the magnetic flux compensation member extends vertically by a first distance, wherein a virtual connection line having a shortest distance and connecting the secondary coil and the main circuit to other overlaps the magnetic core by the first distance.

6. The current transformer of claim 5, wherein the magnetic flux compensation member includes a plate-shaped member having a predetermined thickness and having a vertical dimension equal to the first distance.

* * * * *